(12) United States Patent
    Chien et al.

(10) Patent No.: US 9,293,490 B2
(45) Date of Patent: Mar. 22, 2016

(54) DEEP TRENCH ISOLATION WITH AIR-GAP IN BACKSIDE ILLUMINATION IMAGE SENSOR CHIPS

(71) Applicant: Taiwan Semiconductor Manufacturing Company, Ltd., Hsin-Chu (TW)

(72) Inventors: Volume Chien, Tainan (TW); Yu-Heng Cheng, Lukang Township (TW); Huan-En Lin, Kaohsiung (TW); Chi-Cherng Jeng, Tainan (TW); Fu-Tsun Tsai, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 26 days.

(21) Appl. No.: 14/213,542

(22) Filed: Mar. 14, 2014

(65) Prior Publication Data

US 2015/0263054 A1 Sep. 17, 2015

(51) Int. Cl.
    *H01L 27/146* (2006.01)

(52) U.S. Cl.
    CPC ...... *H01L 27/14623* (2013.01); *H01L 27/1463* (2013.01); *H01L 27/1464* (2013.01); *H01L 27/14629* (2013.01); *H01L 27/14685* (2013.01); *H01L 27/14621* (2013.01); *H01L 27/14627* (2013.01); *H01L 27/14636* (2013.01); *H01L 27/14643* (2013.01); *H01L 27/14689* (2013.01)

(58) Field of Classification Search
    None
    See application file for complete search history.

(56) References Cited

U.S. PATENT DOCUMENTS

| 8,530,266 | B1 * | 9/2013 | Chen et al. ...................... 438/73 |
| 2009/0200625 | A1 * | 8/2009 | Venezia et al. ................ 257/432 |
| 2010/0176474 | A1 * | 7/2010 | Kwon et al. .................... 257/432 |
| 2011/0108938 | A1 * | 5/2011 | Nozaki et al. .................. 257/432 |
| 2012/0086091 | A1 * | 4/2012 | Crocherie ....................... 257/432 |
| 2012/0153128 | A1 * | 6/2012 | Roy et al. .................... 250/208.1 |
| 2012/0217605 | A1 * | 8/2012 | Kunikiyo ....................... 257/443 |
| 2013/0285181 | A1 * | 10/2013 | Lin et al. ........................ 257/432 |
| 2014/0054662 | A1 * | 2/2014 | Yanagita et al. ............... 257/291 |
| 2014/0239362 | A1 * | 8/2014 | Koo et al. ...................... 257/294 |
| 2014/0361355 | A1 * | 12/2014 | Shin et al. ...................... 257/292 |
| 2014/0367817 | A1 * | 12/2014 | Furuta ........................... 257/432 |

* cited by examiner

*Primary Examiner* — Michael Lebentritt
*Assistant Examiner* — Jordan Klein
(74) *Attorney, Agent, or Firm* — Slater & Matsil, L.L.P.

(57) ABSTRACT

An integrated circuit structure includes a semiconductor substrate, an image sensor extending from a front surface of the semiconductor substrate into the semiconductor substrate, and an isolation structure extending from a back surface of the semiconductor substrate into the semiconductor substrate, wherein the isolation structure includes an air-gap therein. An air-gap sealing layer is on a backside of the semiconductor substrate. The air-gap sealing layer seals the air-gap, wherein the air-gap sealing layer includes a portion exposed to the air-gap.

20 Claims, 10 Drawing Sheets

1

DEEP TRENCH ISOLATION WITH AIR-GAP IN BACKSIDE ILLUMINATION IMAGE SENSOR CHIPS

BACKGROUND

Image sensor chips, which include front-side illumination image sensor chips and Backside Illumination (BSI) image sensor chips, are widely used in applications such as cameras. In the formation of image sensor chips, image sensors (such as photo diodes) and logic circuits are formed on a silicon substrate of a wafer, followed by the formation of an interconnect structure on a front side of the wafer. In the front side image sensor chips, color filters and micro-lenses are formed over the interconnector structure. In the formation of the BSI image sensor chips, after the formation of the interconnect structure, the wafer is thinned, and backside structures such as color filters and micro-lenses are formed on the backside of the wafer. When the image sensor chips are used, light is projected on the image sensors, in which the light is converted into electrical signals.

In the image sensor chips, deep trenches are formed in the silicon substrate to separate the image sensors from each other. The deep trenches are filled with dielectric materials, which may include an oxide, to isolate the neighboring devices from each other.

The image sensors in the image sensor chips generate electrical signals in response to the stimulation of photons. The light received by one micro-lens and the underlying color filter, however, may be tilted. The tilted light may penetrate through the deep trench that is used to separate the image sensors. As a result, cross-talk occurs due to the interference of the light that is undesirably received from neighboring pixels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
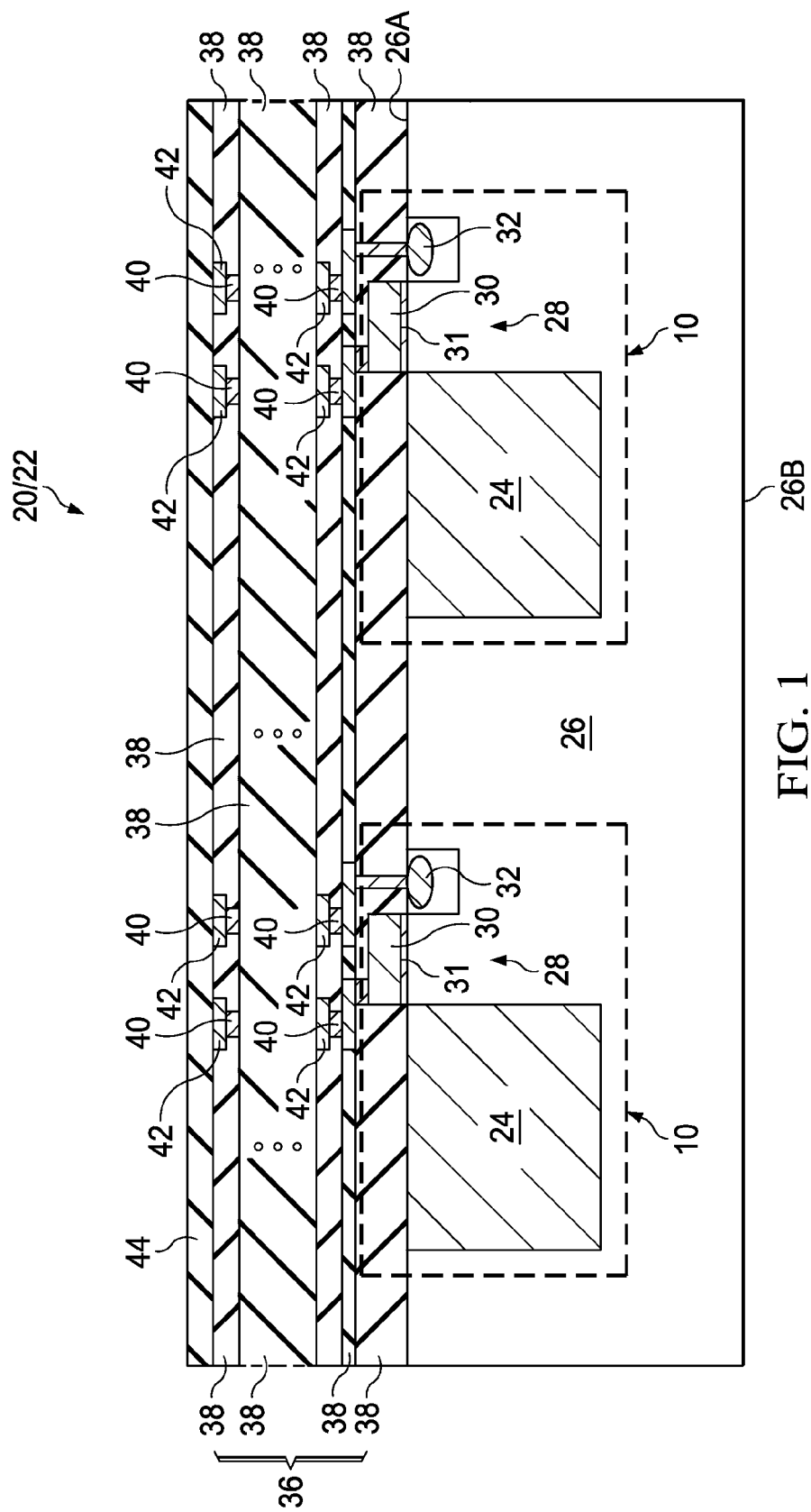
FIGS. 1 through 8 illustrate the cross-sectional views of intermediate stages in the formation of a Backside Illumination (BSI) image sensor chip in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "overlying," "below," "lower," "underlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Backside Illumination (BSI) image sensor chip and the method of forming the same are provided in accordance with various exemplary embodiments. The intermediate stages of forming the BSI image sensor chip are illustrated. The variations of the embodiments are discussed. Throughout the various views and illustrative embodiments, like reference numbers are used to designate like elements.

FIGS. 1 through 8 illustrate the cross-sectional views of intermediate stages in the formation of a BSI image sensor chip/wafer in accordance with some exemplary embodiments. FIG. 1 illustrates the formation of image sensor chip 20, which may be a part of wafer 22 that includes a plurality of image sensor chips 20 therein. Image sensor chip 20 includes semiconductor substrate 26, which may be a crystalline silicon substrate or a semiconductor substrate formed of other semiconductor materials. Throughout the description, surface 26A is referred to as a front surface of semiconductor substrate 26, and surface 26B is referred to as a back surface of semiconductor substrate 26. Image sensors 24 are formed from front surface 26A of semiconductor substrate 26, for example, through implantations. Image sensors 24 are configured to convert light signals (photons) to electrical signals, and may be photo-sensitive Metal-Oxide-Semiconductor (MOS) transistors or photo-sensitive diodes. Throughout the description, image sensors 24 are alternatively referred to as photo diodes 24, although they may be other types of image sensors. In some exemplary embodiments, photo diodes 24 extend from front surface 26A into semiconductor substrate 26, and form an image sensor array, which is illustrated in a top view shown in FIG. 9.

FIG. 1 also illustrates exemplary Metal-Oxide-Semiconductor (MOS) transistors, which are formed at front surface 26A. In some exemplary embodiments, each of photo diodes 24 is electrically coupled to a first source/drain region of transfer gate transistor 28, which includes gate 30 and gate dielectric 31. Gate dielectric 31 is in contact with front surface 26A. The first source/drain region of transfer gate transistor 28 may be shared by the connecting photo diode 24. Floating diffusion capacitor 32 is formed in substrate 26, for example, through implanting into substrate 26 to form a p-n junction, which acts as floating diffusion capacitor 32. Floating diffusion capacitor 32 may be formed in a second source/drain region of transfer gate transistor 28, and hence one of the capacitor plates of floating diffusion capacitor 32 is electrically coupled to the second source/drain region of transfer gate transistor 28. Photo diodes 24, transfer gate transistors 28, and floating diffusion capacitors 32 form pixel units 10.

Front-side interconnect structure 36 is formed over semiconductor substrate 26. Front-side interconnect structure 36 is used to electrically interconnect the devices in image sensor chip 20. Front-side interconnect structure 36 includes dielectric layers 38, and metal lines 42 and vias 40 in dielectric layers 38. Throughout the description, the metal lines 42 in a same dielectric layer 38 are collectively referred to as being a metal layer. Front-side interconnect structure 36 may include a plurality of metal layers. In some exemplary embodiments, dielectric layers 38 include low-k dielectric layers. The low-k dielectric layers have low k values, for example, lower than about 3.0. One or more passivation layer 44 is formed over dielectric layers 38. The passivation layers 44 may be formed of non-low-k dielectric materials having k values equal to or greater than about 3.8. In some embodiments, passivation layers 44 include a silicon oxide layer and a silicon nitride layer on the silicon oxide layer.

Figure 2:
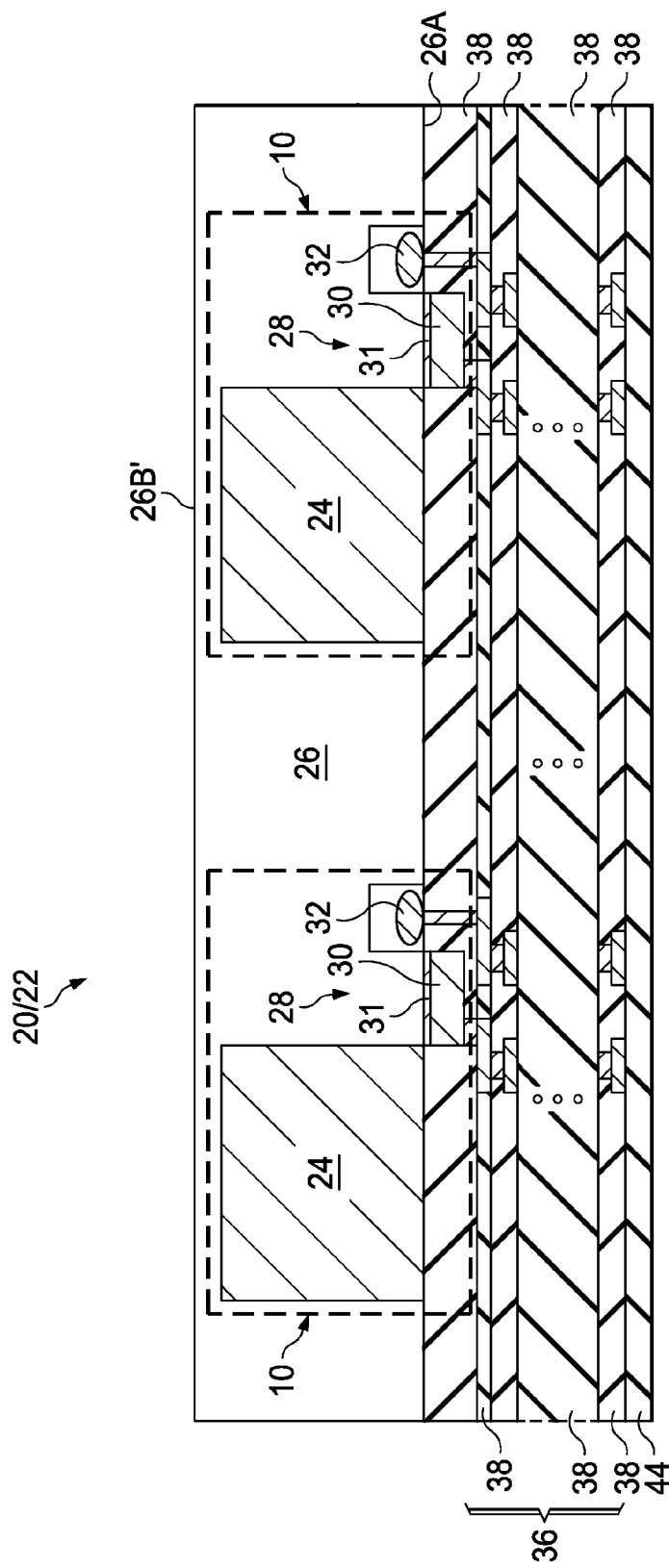

Referring to FIG. 2, wafer 22 is flipped, and a backside grinding is performed to grind back surface 26B (FIG. 1) to thin semiconductor substrate 26. The resulting back surface is referred to as 26B'. The thickness of substrate 26 is reduced to smaller than about 10 μm, or smaller than about 5 μm, for example. With semiconductor substrate 26 having a small thickness, light can penetrate from back surface 26B' into semiconductor substrate 26, and reach photo diodes 24.

Figure 3:
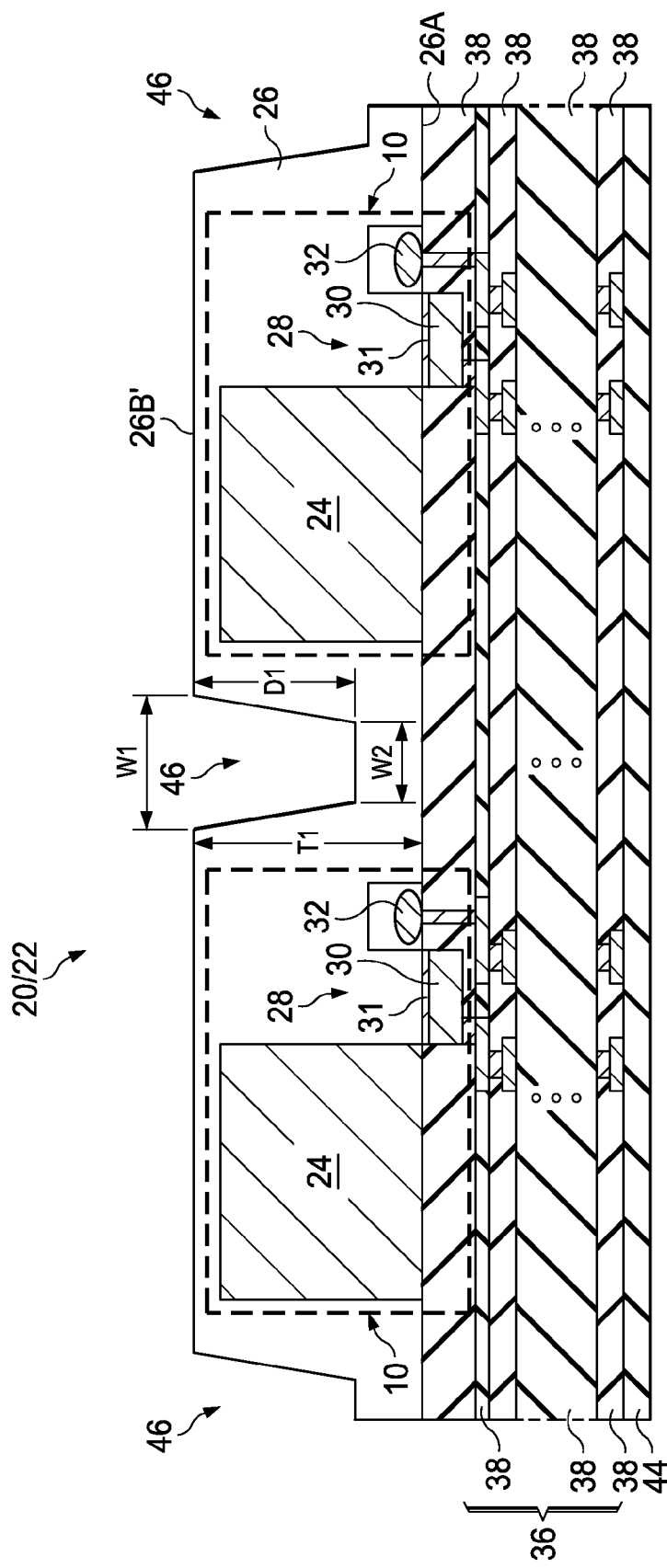

Referring to FIG. 3, semiconductor substrate 26 is recessed in an anisotropic etching, so that trenches 46 are formed. Trenches 46 may have bottoms at an intermediate level between front surface 26A and back surface 26B' of semiconductor substrate 26. In some exemplary embodiments, depth D1 of trenches 46 is in the range between about 30 percent and about 80 percent thickness T1 of semiconductor substrate 26. It is appreciated, however, that the values recited throughout the description are merely examples, and may be changed to different values. In some exemplary embodiments, (top) width W1 of trenches 46 is in the range between about 0.04 μm and about 0.25 μm, and depth D1 is in the range between about 0.25 μm and about 3 μm. Aspect ratio D1/W1 of trenches 46 may be greater than about 6, or greater than about 12 in some embodiments. Furthermore, due to the nature of the etching process, trenches 46 may be slightly tapered, with bottom width W2 being smaller than the respective top width W1.

Figure 4:
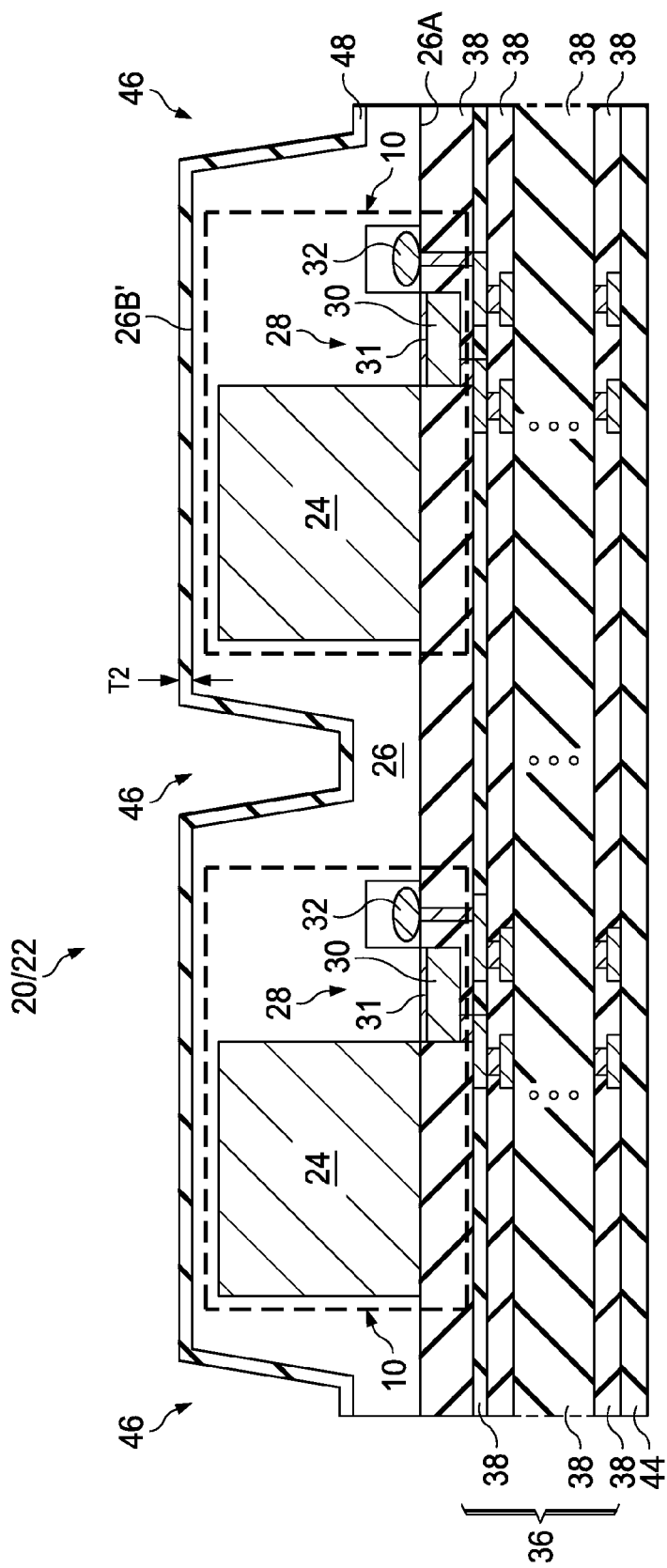

FIG. 4 illustrates the formation of passivation layer 48. In some embodiments, passivation layer 48 is a silicon oxide layer. The silicon oxide layer may be formed using thermal oxidation, for example, in a furnace, wherein oxygen or water steam may be used. The oxidation is performed slowly, so that passivation layer 48 is a dense layer. In some embodiments, thickness T2 of passivation layer 48 is in the range between about 10 Å and about 100 Å. Passivation layer 48 includes first portion extending into trenches 46 and covering the sidewalls and the bottoms of trenches 46. Furthermore, passivation layer 48 includes second portions over semiconductor substrate 26, wherein the second portions are further in contact with back surface 26B' of semiconductor substrate 26.

Figure 5:
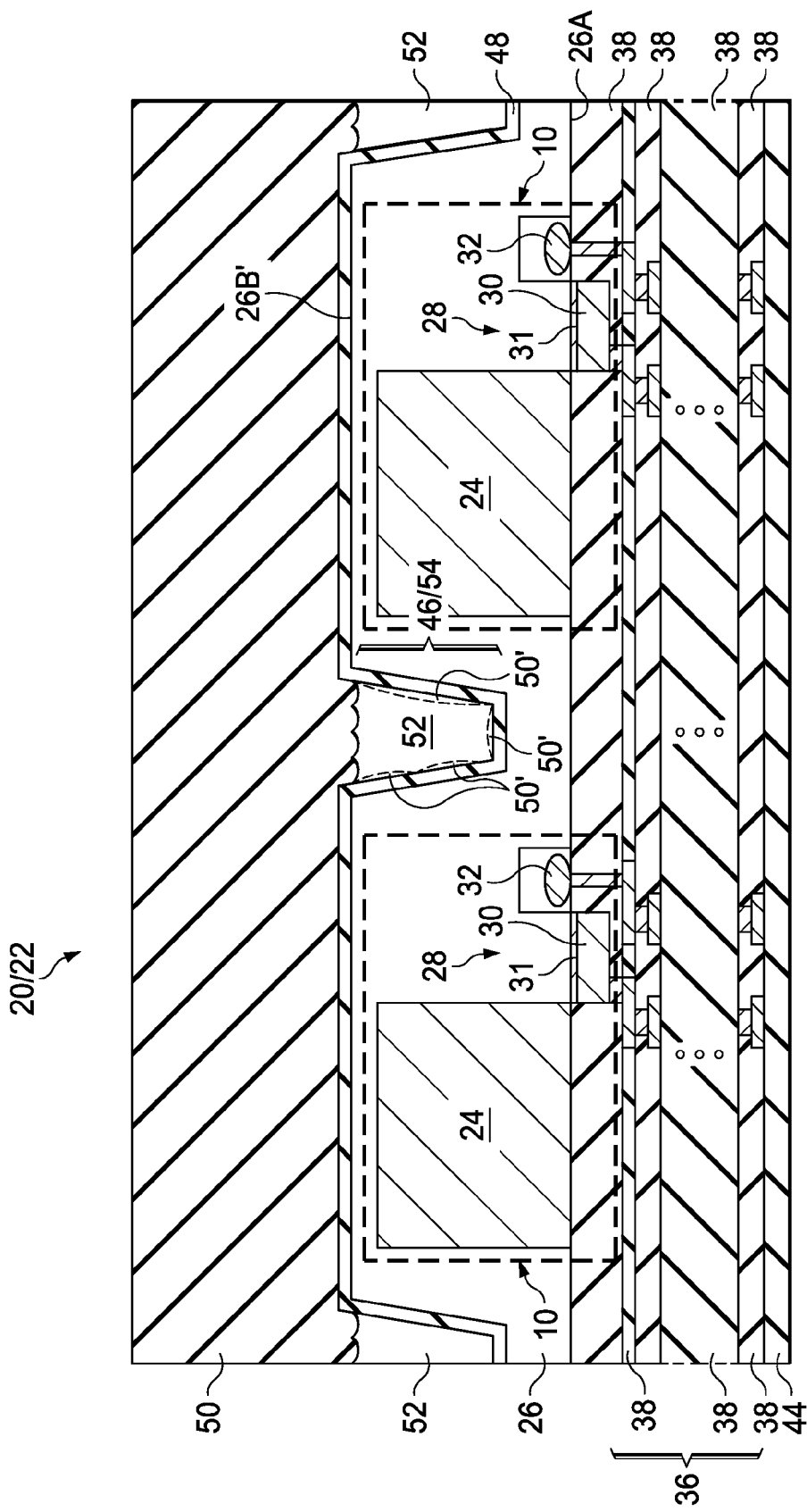
Figure 6:
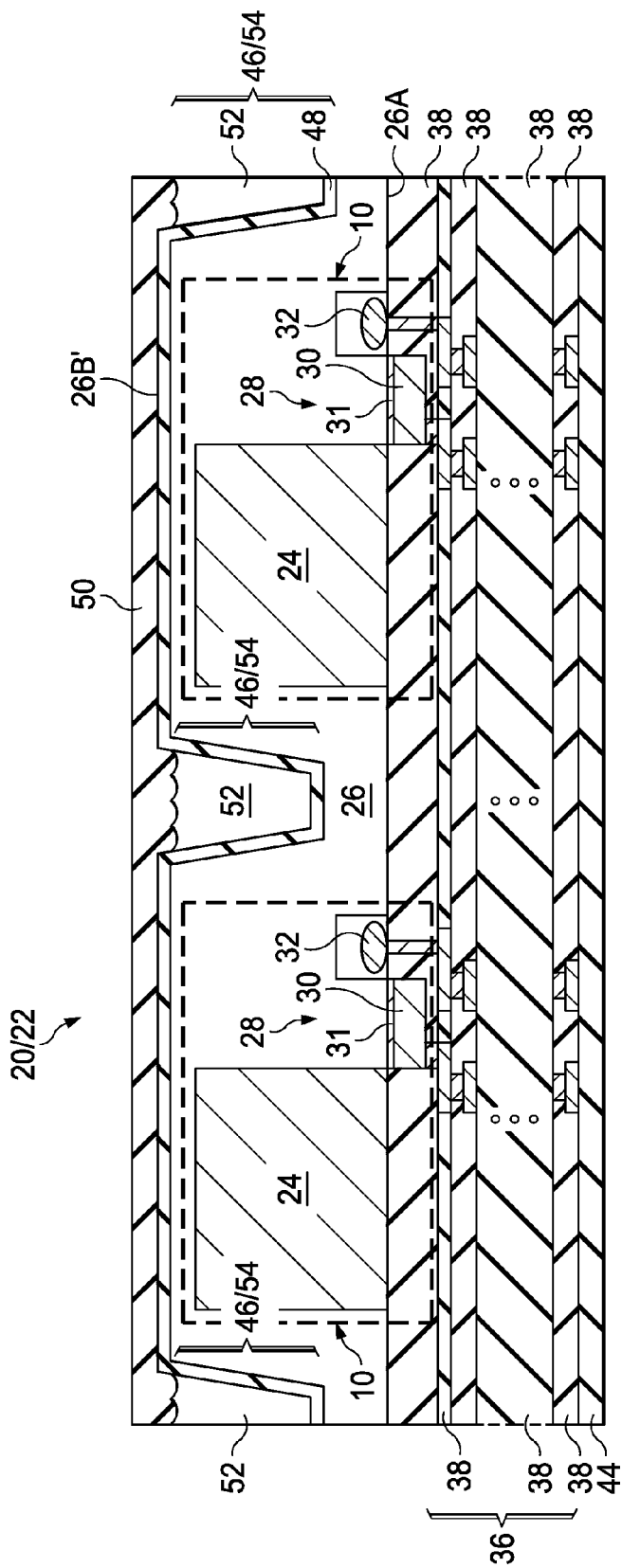

FIG. 5 illustrates the deposition of dielectric layer 50 over passivation layer 48. The deposition of dielectric layer 50 is performed using a method that is free from plasma. For example, dielectric layer 50 may be formed using Chemical Vapor Deposition (CVD), wherein no plasma is generated. In some exemplary embodiments, dielectric layer 50 comprises silicon oxide, wherein the process gases (precursors) such as Tetraethyl Orthosilicate (TEOS) and ozone (O3) may be used. Due to the high aspect ratio of trenches 46, and possibly further due to the lack of plasma in the deposition, voids 52 are formed in trenches 46, and are sealed by dielectric layer 50. Throughout the description, voids 52 are alternatively referred to as air-gaps 52, although voids 52 may be filled with air later, or may remain to be vacuumed.

In the deposition, some portions 50' of dielectric layer 50 may be deposited into trenches 46, and are deposited on the sidewalls of trenches 46, wherein dashed lines schematically represent these portions of dielectric layer 50. Depending on the aspect ratio of trenches 46 and some other factors, portions 50' may cover more or less of the sidewalls of trenches 46. For example, as shown in FIG. 5, some portions of the sidewall portions of trenches 46 are covered by portions 50', and some portions of the sidewall portions of trenches 46 are not covered. Similarly, some portions of the bottoms of trenches 46 are covered by portions 50', and some other portions of the bottoms of trenches 46 are not covered.

FIG. 6A illustrates a Chemical Mechanical Polish (CMP) or grinding of dielectric layer 50, so that the top surface of dielectric layer 50 is planarized, and the thickness of dielectric layer 50 is reduced. After the CMP, dielectric layer 50 remains to seal air-gaps 52. Throughout the description, the portions of passivation layer 48, dielectric layer 50 and the air-gap 52 therein are in combination referred to as isolation grid 54, which has the shape of a grid in the top view of the structure in FIG. 6A, as illustrated in FIG. 9.

Figure 9:
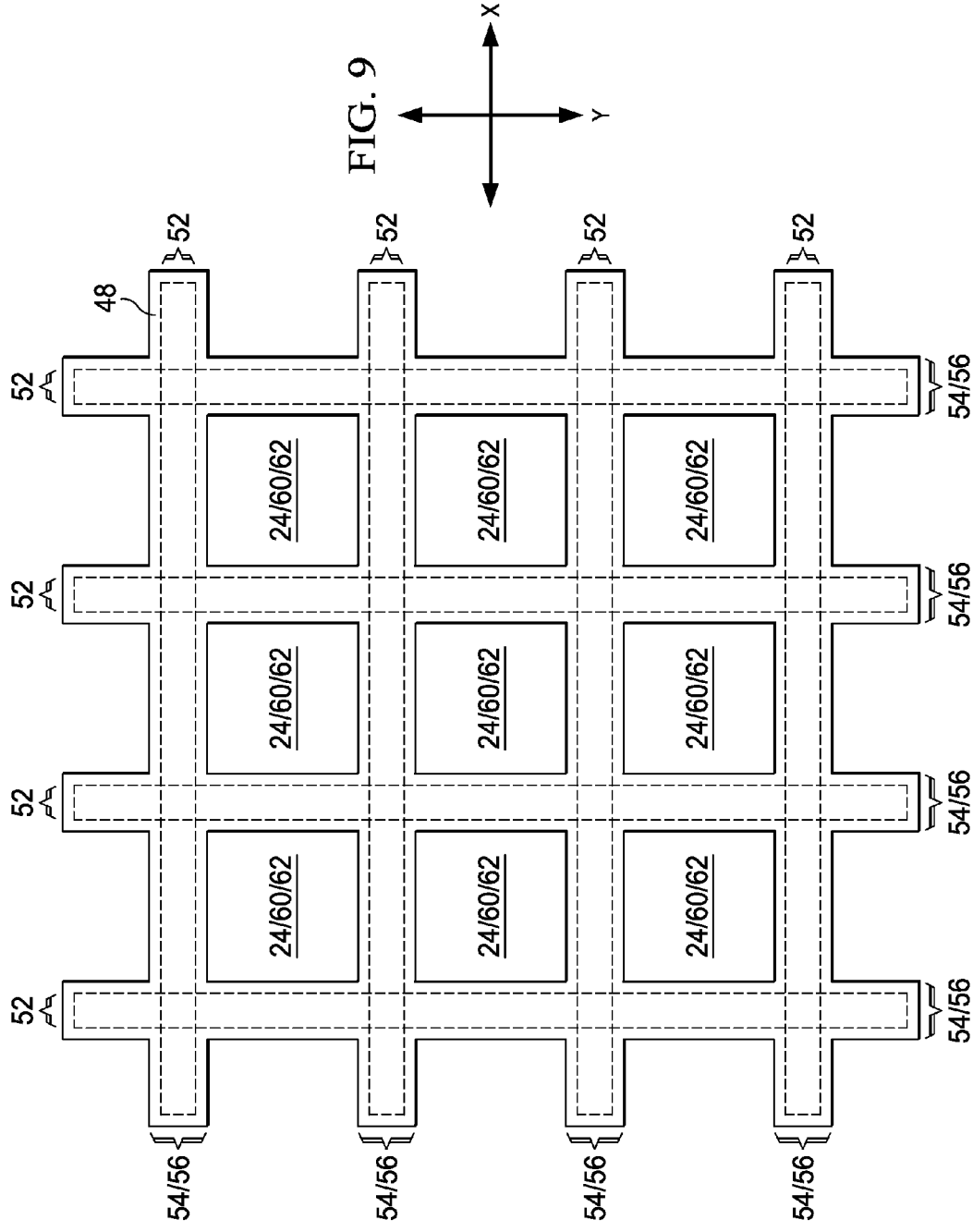
FIG. 9 illustrates a top view of the BSI image sensor chip, wherein an isolation structure and the air-gaps therein form grids.

As shown in FIG. 9, isolation grid 54 separates semiconductor substrate 26 (FIG. 6) into a plurality of rows and columns of rectangular substrate regions, wherein each of the rectangular substrate regions may include one photo diode 24 therein. Isolation grid 54 includes a first plurality of isolation strips with lengthwise directions extending in a first horizontal direction (X-direction), and a second plurality of isolation strips with lengthwise directions extending in a second horizontal direction (Y-direction). The transistors such as transfer gate transistor 28 (FIG. 6) are also formed at the front surface region of the respective semiconductor substrate region. As also shown in FIG. 9, air-gaps 52 may also form a grid including a first plurality of air-gap strips extending in the X-direction, and a second plurality of air-gap strips extending in the Y-direction, wherein the first plurality of air-gap strips and the second plurality of air-gap strips are interconnected.

Figure 7:
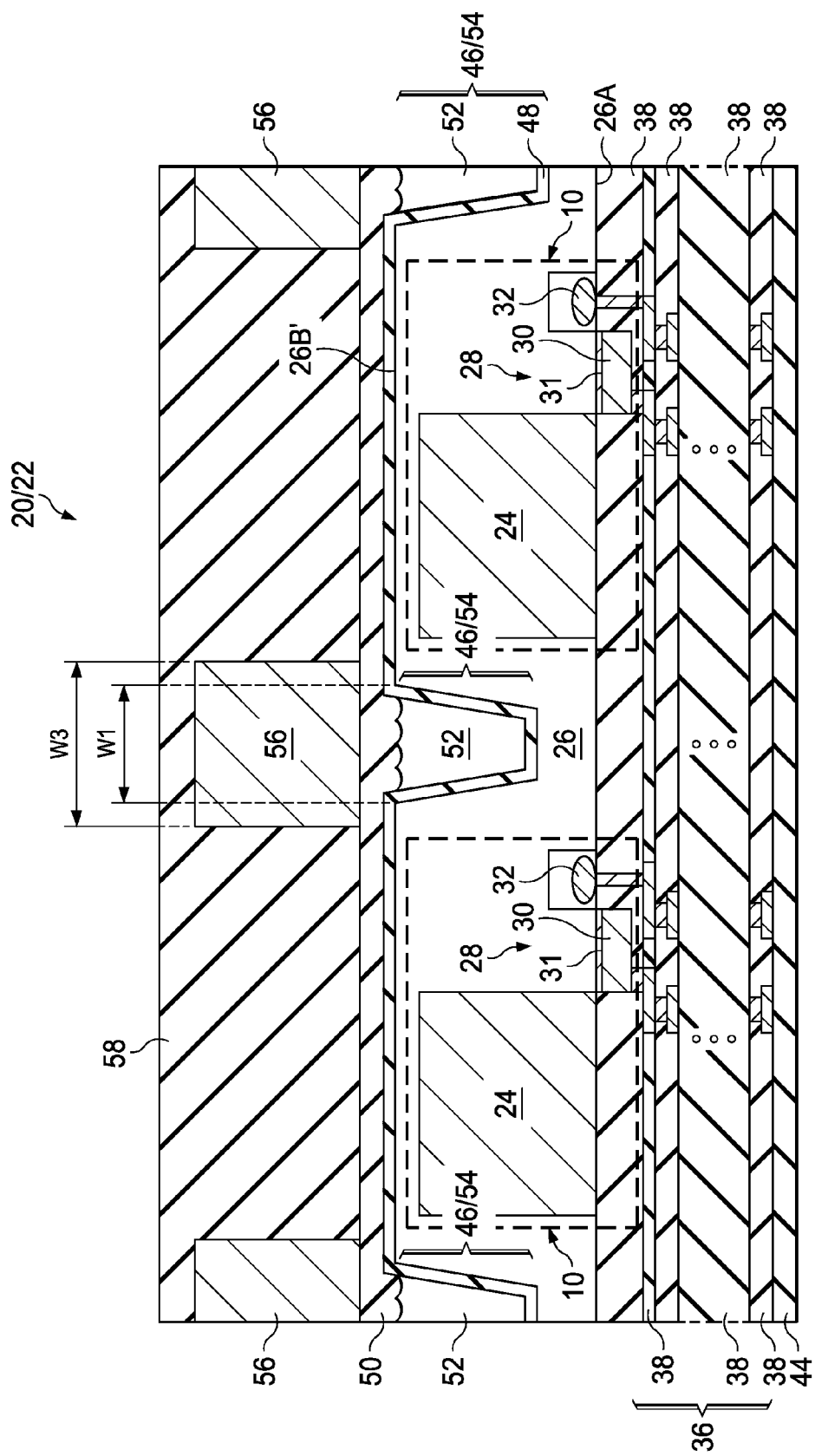

FIG. 7 illustrates the formation of metal grid 56. In some embodiments, the metals in metal grid 56 include tungsten, aluminum, copper, and/or the like. The thickness of metal grid 56 may be greater than about 2,000 Å, for example. Metal grid 56 overlaps isolation grid 54. As shown in FIG. 9, metal grid 56 also includes a first plurality of metal lines extending in the X-direction, and a second plurality of metal lines extending in the Y-direction, wherein the second plurality of metal lines is connected to the first plurality of metal lines. In some embodiments, as shown in FIG. 7, width W3 of the metal lines in metal grid 56 is greater than or equal to width W1 of the isolation strips in isolation grid 54. Hence, the metal lines in metal grid 56 may expand horizontally beyond the edges of the respective underlying isolation strips of isolation grid 54. In alternative embodiments, width W3 is smaller than width W1 of isolation grid 54.

FIG. 7 also illustrates the formation of oxide layer 58, which is a transparent layer. In some embodiments, oxide layer 58 is a silicon oxide layer formed using Plasma Enhance Chemical Vapor Deposition (PECVD). A planarization step such as CMP may be performed to level the top surface of oxide layer 58. Oxide layer 58 fills the openings formed between the grid lines of metal grid 56, and may, or may not, further include portions over metal grid 56.

Figure 8:
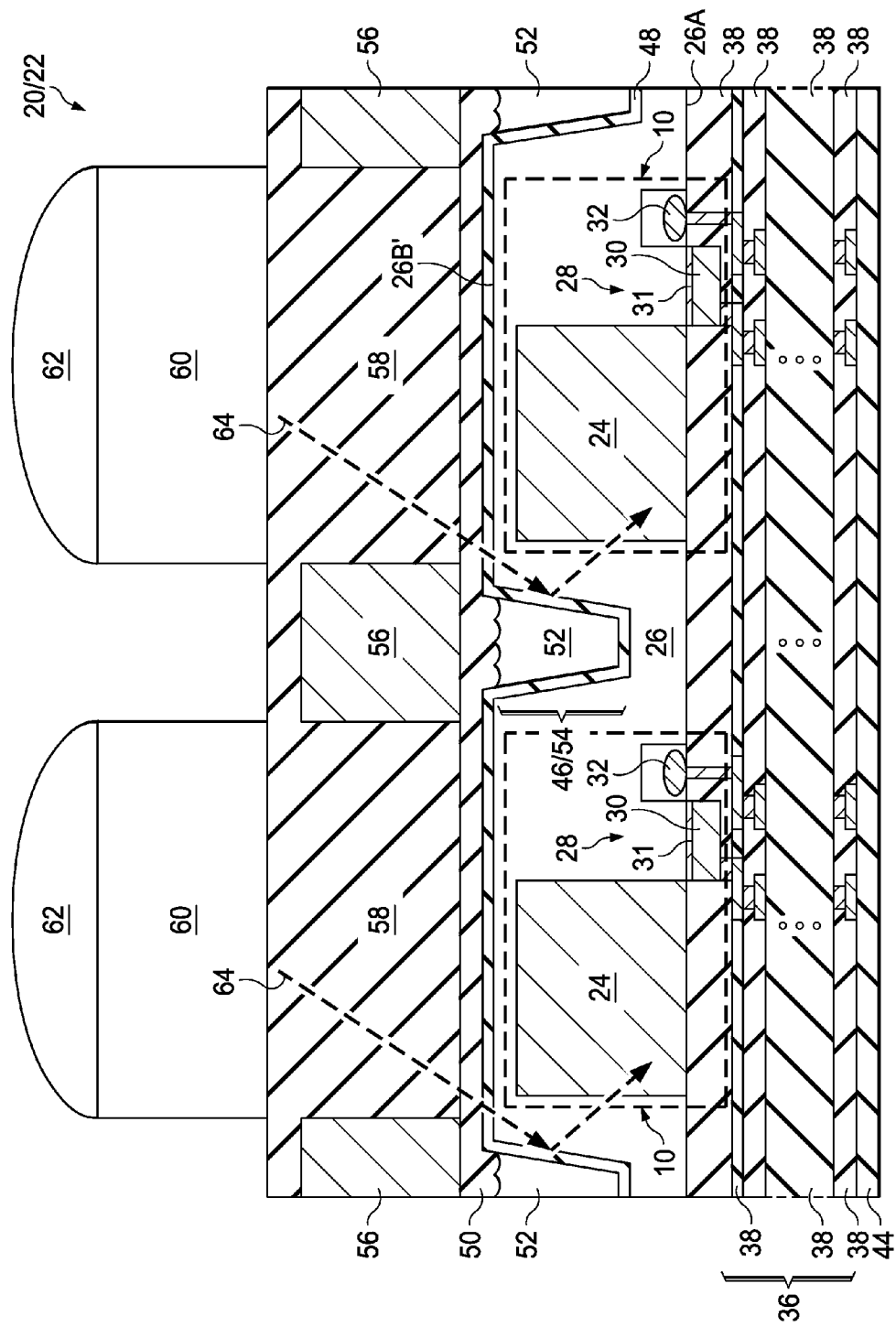

In subsequent process steps, as shown in FIG. 8, additional components such as color filters 60 and micro-lenses 62 are formed, with each of photo diodes 24 aligned to one of color filters 60 and one of micro-lenses 62.

Figure 10:
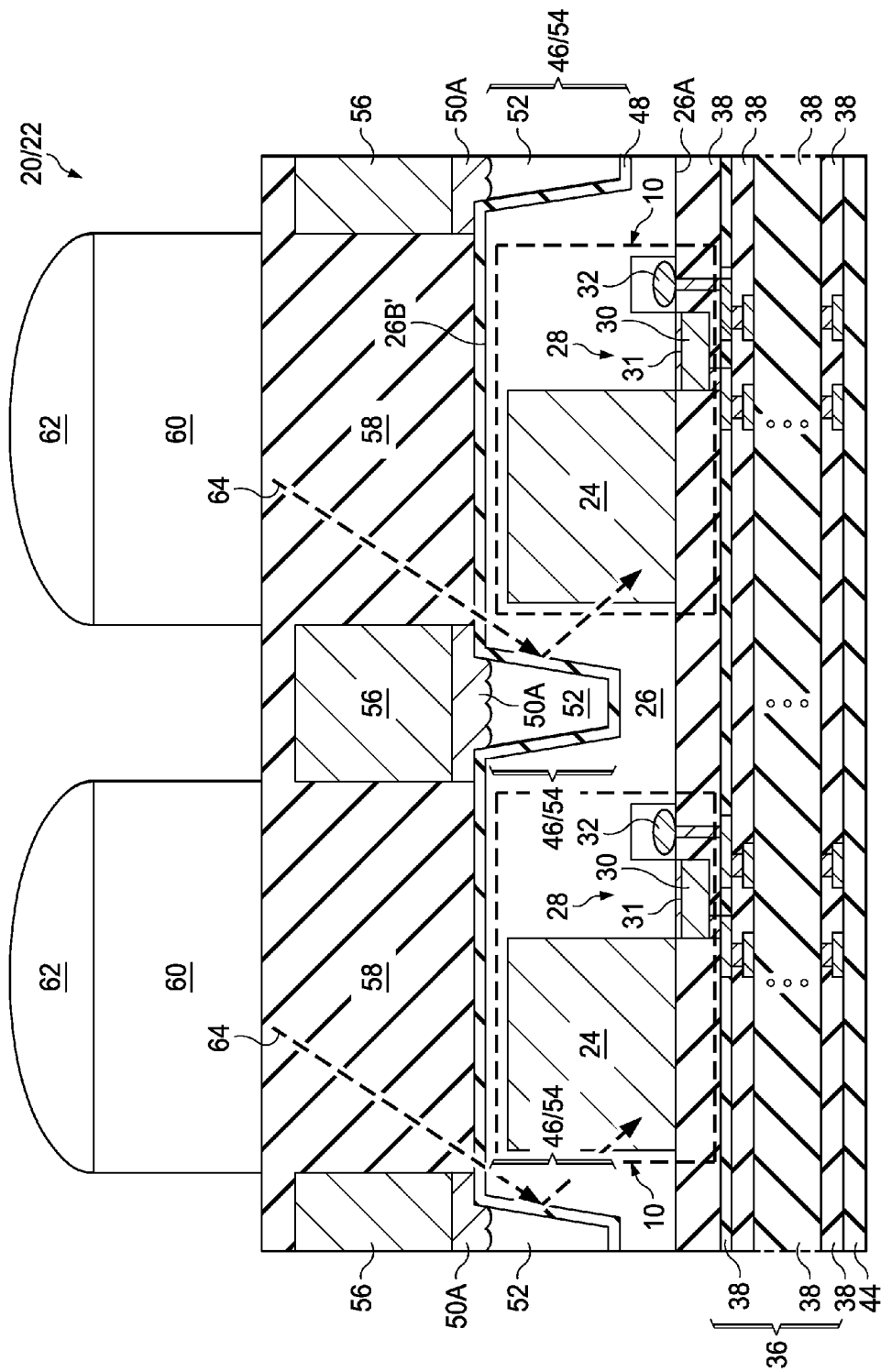
FIG. 10 illustrates the cross-sectional view of a BSI image sensor chip in accordance with alternative embodiments.

FIG. 10 illustrates image sensor chip/wafer 20/22 in accordance with alternative embodiments. These embodiments are similar to the embodiments as shown in FIG. 8, except that dielectric layer 50 in FIG. 8 is replaced with layer 50A, which may be a metal layer or a high-k dielectric layer. When layer 50A is a metal layer, layer 50A may comprise tungsten, AlCu, or alloys thereof. When layer 50A is a high-k dielectric layer, layer 50A may comprise SiN. In these embodiments, layer 50A is patterned, and the portions of layer 50A directly overlying isolation grid 54 are left un-removed, while the portion of layer 50A directly overlying photo diodes 24 are removed to allow light to pass. In these embodiments, oxide layer 58 is filled into the spaces left by the patterned layer 50A, wherein oxide layer 58 may contact passivation layer 48 in some embodiments. Throughout the description, dielectric layer 50 (FIG. 8) and layer 50A (FIG. 10) are both referred to as air-gap sealing layers.

The embodiments of the present disclosure have some advantageous features. The formation of the air-gap sealing layers does not adopt plasma. Since the plasma causes damage to semiconductor substrate 26, with plasma not used, the respective damage to semiconductor substrate 26 is avoided. Furthermore, as shown in FIGS. 8 and 10, by forming voids, the tilted light 64 has a higher chance to be reflected in a total reflection since the refractive index of air-gap is 1.0, which is smaller than the refractive index of silicon oxide (about 1.46). With the total reflection, tilted light 64 will not penetrate the isolation grid 54, and will not be received by neighboring photo diodes 24. The cross-talk is thus reduced.

In accordance with some embodiments of the present disclosure, an integrated circuit structure includes a semiconductor substrate, an image sensor extending from a front surface of the semiconductor substrate into the semiconductor substrate, and an isolation structure extending from a back surface of the semiconductor substrate into the semiconductor substrate, wherein the isolation structure includes an air-gap therein. An air-gap sealing layer is on a backside of the semiconductor substrate. The air-gap sealing layer seals the air-gap, wherein the air-gap sealing layer includes a portion exposed to the air-gap.

In accordance with alternative embodiments of the present disclosure, an integrated circuit structure includes a semiconductor substrate, and an isolation structure extending from a back surface of the semiconductor substrate into the semiconductor substrate. The isolation structure includes an air-gap therein. The isolation structure forms a grid. The integrated circuit structure further includes a plurality of image sensors in regions defined by the grid, and an oxide layer over the semiconductor substrate and on a backside of the semiconductor substrate, wherein the oxide layer includes a portion exposed to the air-gap. A transistor is at a front surface of the semiconductor substrate, with the front surface and the back surface being opposite surfaces of the semiconductor substrate. A metal grid includes metal lines overlapping respective portions of the isolation structure. A plurality of color filters is over the metal grid, wherein the plurality of color filters overlaps respective ones of the plurality of image sensors.

In accordance with yet alternative embodiments of the present disclosure, a method includes forming image sensors extending from a front surface of a semiconductor substrate into the semiconductor substrate, etching the semiconductor substrate to form a trench extending from a back surface of the semiconductor substrate into the semiconductor substrate, and forming an air-gap sealing layer on a backside of the semiconductor substrate. An air-gap is sealed in the trench by the air-gap sealing layer, with the air-gap sealing layer exposed to the air-gap. A metal grid is formed on a backside of the semiconductor substrate, wherein a portion of the metal grid is aligned to the air-gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a semiconductor substrate;
   an image sensor extending from a front surface of the semiconductor substrate into the semiconductor substrate;
   an isolation structure extending from a back surface of the semiconductor substrate into the semiconductor substrate, wherein the isolation structure comprises an air-gap;
   an air-gap sealing layer on a backside of the semiconductor substrate, wherein the air-gap sealing layer seals the air-gap, and wherein the air-gap sealing layer comprises a portion exposed to the air-gap; and
   a metal grid comprising a portion overlapping the air-gap, wherein the air-gap sealing layer comprises a high-k dielectric material, and edges of the air-gap sealing layer are aligned to respective edges of the metal grid.

2. The integrated circuit structure of claim 1 further comprising a transistor at the front surface of the semiconductor substrate.

3. The integrated circuit structure of claim 1, wherein the air-gap comprises:
   a first plurality of air-gap strips having lengthwise directions parallel to a first direction; and
   a second plurality of air-gap strips having lengthwise directions parallel to a second direction, wherein the first plurality of air-gap strips and the second plurality of air-gap strips are interconnected.

4. The integrated circuit structure of claim 1, wherein the metal grid comprises:
   a first plurality of metal lines having lengthwise directions parallel to a first direction; and
   a second plurality of metal lines having lengthwise directions parallel to a second direction, wherein the first plurality of metal lines and the second plurality of metal lines are interconnected.

5. The integrated circuit structure of claim 1 further comprising a passivation layer comprising:
   a first portion extending into, and in contact with, the semiconductor substrate; and
   a second portion in contact with the back surface of the semiconductor substrate.

6. The integrated circuit structure of claim 1, wherein the air-gap sealing layer comprises an oxide.

7. The integrated circuit structure of claim 1 further comprising:
   a transparent layer filling spaces between grid lines of the metal grid, wherein the transparent layer comprises edges contacting edges of the air-gap sealing layer.

8. An integrated circuit structure comprising:
   a semiconductor substrate;

an isolation structure extending from a back surface of the semiconductor substrate into the semiconductor substrate, wherein the isolation structure comprises an air-gap, and wherein the isolation structure forms a grid;

a passivation layer comprising:
- a first portion extending into, and in contact with, the semiconductor substrate, wherein the first portion is a part of the isolation structure; and
- a second portion in contact with the back surface of the semiconductor substrate.

a plurality of image sensors in regions defined by the grid;

a high-k dielectric layer over and contacting the passivation layer, wherein the high-k dielectric layer comprises a portion exposed to the air-gap;

a metal grid comprising metal lines overlapping respective portions of the high-k dielectric layer;

a transparent layer filling grid openings of the metal grid, wherein the transparent layer comprises a bottom surface contacting a top surface of the passivation layer; and a plurality of color filters over the metal grid, wherein the plurality of color filters overlaps respective ones of the plurality of image sensors.

9. The integrated circuit structure of claim 8, wherein the air-gap comprises:
- a first plurality of air-gap strips having lengthwise directions parallel to a first direction; and
- a second plurality of air-gap strips having lengthwise directions parallel to a second direction, wherein the first plurality of air-gap strips and the second plurality of air-gap strips are interconnected.

10. The integrated circuit structure of claim 8, wherein the isolation structure extends from the back surface of the semiconductor substrate to an intermediate level of the semiconductor substrate, and wherein the intermediate level is between the back surface and a front surface of the semiconductor substrate.

11. The integrated circuit structure of claim 8, wherein the isolation structure comprises a plurality of isolation strips, and wherein each of the isolation strips has lower portions increasingly narrower than upper portions.

12. The integrated circuit structure of claim 8, wherein the metal lines of the metal grid extend beyond opposite edges of respective underlying isolation lines of the isolation structure in opposite directions.

13. The integrated circuit structure of claim 8, wherein grid lines of the metal grid are co-terminus with respective underlying ones of the high-k dielectric layer.

14. The integrated circuit structure of claim 8, wherein the transparent layer contacts sidewalls of the portions of the air-gap sealing layer.

15. A method comprising:
- forming image sensors extending from a front surface of a semiconductor substrate into the semiconductor substrate;
- etching the semiconductor substrate to form a trench extending from a back surface of the semiconductor substrate into the semiconductor substrate;
- forming an air-gap sealing layer on a backside of the semiconductor substrate, wherein a air-gap is sealed in the trench by the air-gap sealing layer, with the air-gap sealing layer exposed to the air-gap, wherein the air-gap sealing layer is a high-k dielectric layer;
- forming a metal grid on a backside of the semiconductor substrate, wherein a portion of the metal grid is aligned to the air-gap; and
- patterning the air-gap sealing layer, wherein remaining portions of the air-gap sealing layer are aligned to edges of respective overlying grid lines of the metal grid.

16. The method of claim 15, wherein the forming the air-gap sealing layer comprises chemical vapor deposition, and wherein the chemical vapor deposition is free from plasma.

17. The method of claim 15, wherein the forming the air-gap sealing layer comprises physical vapor deposition.

18. The method of claim 15, wherein the air-gap sealing layer comprises an oxide, and wherein the method further comprises:
- filling an oxide into grid openings defined by the metal grid.

19. The method of claim 15, wherein the air-gap sealing layer comprises a metal layer or a high-k dielectric layer, and wherein the method further comprises:
- patterning the air-gap sealing layer to remove first portions of the air-gap sealing layer that are aligned to the image sensors, wherein second portions of the air-gap sealing layer aligned to the image sensors remain after the patterning; and
- after the patterning, filling an oxide into grid openings defined by the metal grid, wherein the oxide extends into spaces left by removed portions of the air-gap sealing layer.

20. The method of claim 15, wherein each of the trench and the air-gap forms a grid.

* * * * *